(12) United States Patent
Nomura et al.

(10) Patent No.: US 8,222,519 B2
(45) Date of Patent: Jul. 17, 2012

(54) MEROCYANINE DYE AND PHOTOELECTRIC CONVERSION DEVICE

(75) Inventors: Kimiatsu Nomura, Kanagawa (JP); Rui Shen, Tokyo (JP); Hideyuki Suzuki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 749 days.

(21) Appl. No.: 12/354,965

(22) Filed: Jan. 16, 2009

(65) Prior Publication Data

US 2009/0184235 A1 Jul. 23, 2009

(30) Foreign Application Priority Data

Jan. 18, 2008 (JP) ................... 2008-009436

(51) Int. Cl.
- H01L 31/04 (2006.01)
- C07D 215/14 (2006.01)
- C07D 211/82 (2006.01)
- C07D 277/64 (2006.01)
- C07D 277/84 (2006.01)
- C07D 263/56 (2006.01)
- C07D 263/30 (2006.01)
- C07D 235/12 (2006.01)
- C07D 209/60 (2006.01)
- C07D 209/12 (2006.01)

(52) U.S. Cl. ........ 136/263; 546/152; 546/285; 548/150; 548/207; 548/217; 548/304.4; 548/427; 548/490

(58) Field of Classification Search ................... None
See application file for complete search history.

(56) References Cited

FOREIGN PATENT DOCUMENTS

| | | |
|---|---|---|
| JP | 10-309871 * | 11/1998 |
| JP | 2003-332551 A | 11/2003 |
| JP | 2006-86160 A | 3/2006 |
| JP | 2007-234650 A | 9/2007 |

OTHER PUBLICATIONS

D.L. Morel et al., Organic Photovoltaic Cells. Correlations between Cell Performance and Molecular Structure, The Journal of Physical Chemistry, 1984, pp. 923-933, vol. 88, No. 5, American Chemical Society.

* cited by examiner

*Primary Examiner* — Rebecca Anderson
*Assistant Examiner* — Alicia L Otton
(74) *Attorney, Agent, or Firm* — Sughrue Mion, PLLC (57) ABSTRACT

A merocyanine dye is provided. The merocyanine dye is represented by formula (1).

Formula (1):

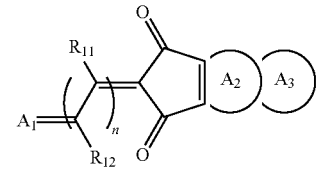

In the formula (1), $A_1$ represents a divalent atomic group, n represents an integer of 1 to 3, $A_2$ and $A_3$ each independently represent an aromatic hydrocarbon ring or a heterocyclic ring having 3 to 18 carbon atoms, and $R_{11}$ and $R_{12}$ each independently represent a hydrogen atom, an alkyl group having 1 to 18 carbon atoms, an aryl group having 6 to 18 carbon atoms, or a heterocyclic group having 3 to 18 carbon atoms.

10 Claims, 3 Drawing Sheets

MEROCYANINE DYE AND PHOTOELECTRIC CONVERSION DEVICE

This application is based on and claims priority under 35 U.S.C. §119 from Japanese Patent Application No. 2008-009436 filed Jan. 18, 2008, the entire disclosure of which is herein incorporated by reference.

BACKGROUND OF THE INVENTION

1. Field of the Invention

The present invention relates to a merocyanine dye and a photoelectric conversion device including a pair of electrodes and a photoelectric conversion section which is provided between the pair of electrodes and includes an organic photoelectric conversion layer.

2. Description of Related Art

Merocyanine dyes have been used for a wide range of applications because of their structural diversity and color tones. In particular, merocyanine dyes are useful as light absorption materials since they have highly selective absorption spectra and highly intense absorption spectra, and those having a wide variety of structures have been proposed in the field of silver-salt photography which utilizes their sensitizing powers. Among dyes of cyanine type, merocyanine dyes do not have any ion-pair structures, so they allow the making of organic electronics devices by vacuum evaporation. Applications of merocyanine dyes as organic electronics materials by taking advantage of such a property to photoelectric conversion devices are proposed in JP-A-2003-332551 and JP-A-2006-086160.

In fabrication of traditional visible-light sensors, photoelectric conversion devices are generally made, e.g., by forming PN junctions in semiconductors like Si. Widely used solid-state imaging devices are planar-array photoreceptors which each have photoelectric conversion devices placed in a two-dimensional array in a semiconductor and, in CCD or CMOS format, read out signals generated by photoelectric conversion in each photoelectric conversion device. However, those devices have problems that the aperture rates thereof decrease as they are made finer, and they require additional devices such as lenses. Although various suggestions have been made for improvements of those devices, drawbacks including low efficiency of light utilization still remain.

The method for overcoming such drawbacks is disclosed in JP-A-2003-332551, wherein photoelectric conversion devices are provided throughout the upper side of a readout circuit layer, light absorbed by the whole surface is converted into electric signals by the photoelectric conversion devices, and the electric signals are read out by the lower readout circuitry.

When organic dyes are used as photoelectric conversion materials, wavelength selectivity of their sensitivities that draws on their absorption selectivity is useful, and besides, it is possible to use them without color filters. So, organic dyes have advantages in cost and device performance. And it is also important that organic dyes have larger light absorption constants than inorganic photosensitive materials. From photosensitive layers made thinner by taking advantage of their larger light absorption constants, quality enhancement of light signals obtained can be expected.

Although JP-A-2006-086160, JP-A-2007-234650, Journal of Physical Chemistry, vol. 88, p. 923 (1984) are cited as the cases where merocyanine dyes are used in photoelectric conversion devices, the photoelectric conversion powers attained therein are not sufficient.

SUMMARY OF THE INVENTION

An object of the invention is to provide a merocyanine dye having a novel structure and to provide a photoelectric conversion device which uses such a merocyanine dye and thereby achieves high sensitivity, distinctive spectral sensitivity characteristics, a low dark current and a fast response speed.

The object can be attained by obtaining a merocyanine dye having a novel structure, and by obtaining a photoelectric conversion device equipped with a pair of electrodes and a photoelectric conversion section which is provided between the pair of electrodes and includes a photoelectric conversion layer, wherein the photoelectric conversion layer is formed in containing the merocyanine dye obtained. Specifically, the object can be attained by the following.

(1) A merocyanine dye represented by formula (1):

wherein $A_1$ represents a divalent atomic group, n represents an integer of 1 to 3, $A_2$ and $A_3$ each independently represent an aromatic hydrocarbon ring or a heterocyclic ring having 3 to 18 carbon atoms, and $R_{11}$ and $R_{12}$ each independently represent a hydrogen atom, an alkyl group having 1 to 18 carbon atoms, an aryl group having 6 to 18 carbon atoms, or a heterocyclic group having 3 to 18 carbon atoms.

(2) The merocyanine dye as described in (1), which is represented by formula (2):

wherein $A_1$ represents a divalent atomic group, n represents an integer of 1 to 3, and $R_{11}$ to $R_{18}$ each independently represent a hydrogen atom, an alkyl group having 1 to 18 carbon atoms, an aryl group having 6 to 18 carbon atoms, or a heterocyclic group having 3 to 18 carbon atoms.

(3) The merocyanine dye as described in (2), which is represented by formula (3):

wherein B represents a ring structure, $R_{21}$ to $R_{28}$ each independently represent a hydrogen atom, an alkyl group having 1 to 18 carbon atoms, an aryl group having 6 to 18 carbon atoms, or a heterocyclic group having 3 to 18 carbon atoms, and n represents an integer of 1 to 3.

(4) The merocyanine dye as described in any of (1) to (3), which is a dyestuff or pigment.
(5) A thin dye film comprising the merocyanine dye as described in any of (1) to (4).
(6) A photoelectric conversion device comprising:
  a pair of electrodes; and
  a photoelectric conversion section which is provided between the pair of electrodes and which includes a photoelectric conversion layer containing an organic dye, wherein the organic dye is a merocyanine dye having a fluorescence quantum yield of 10% or higher.
(7) A photoelectric conversion device comprising:
  a pair of electrodes; and
  a photoelectric conversion section which is provided between the pair of electrodes and includes a photoelectric conversion layer containing an organic dye, wherein the organic dye is a merocyanine dye as described in any of (1) to (4).
(8) The photoelectric conversion device as described in (6) or (7), further comprising a charge transporting layer.
(9) The photoelectric conversion device as described in any of (6) to (8), further comprising an electron blocking layer between the pair of electrodes.
(10) The photoelectric conversion device as described in any of (6) to (9), wherein the pair of electrodes contains a transparent conducting oxide (TCO).
(11) The photoelectric conversion device as described in (10), wherein the TCO is iridium tin oxide (ITO).
(12) A method for reading a light signal from a photoelectric conversion device as described in any of (6) to (11), comprising applying a voltage to the photoelectric conversion device.
(13) A method for manufacturing a photoelectric conversion device as described in any of (6) to (11), comprising forming an organic material layer by vacuum heating evaporation.

BRIEF DESCRIPTION OF THE DRAWINGS

The features of the invention will appear more fully upon consideration of the exemplary embodiments of the inventions, which are schematically set forth in the drawings, in which.

DETAILED DESCRIPTION OF THE EXEMPLARY EMBODIMENTS

According to an exemplary embodiment of the invention, an organic photoelectric conversion device that allows efficient readout of signal charges and prevention of image lags can be obtained.

According to an exemplary embodiment of the invention, novel merocyanine dyes can be provided, which are available for dyestuffs, pigments or fluorescent dyes. In addition, photoelectric conversion devices using these dyes can achieve very high photoelectric conversion efficiency and low dark currents, and besides, these devices can ensure excellent response speed and selective spectral sensitivity characteristics for which spectral absorption spectra of the dyes are utilized.

A specific part termed a "group" in the invention means that the part in itself may have no substituent or the part may have one or more (the greatest possible number of) substituents. "An alkyl group", for example, means a substituted or unsubstituted alkyl group. In addition, substituents that the compounds used in the invention can have may be any substituents.

When such a substituent is symbolized by W, the substituent indicated with W may be any substituent, and it has no particular restriction. Examples of W include a halogen atom, an alkyl group (including a cycloalkyl group, a bicycloalkyl group and a tricycloalkyl group), an alkenyl group (including a cycloalkenyl group and a bicycloalkenyl group), an alkynyl group, an aryl group, a heterocyclic group (which may be referred to as a heterocyclic ring group), a cyano group, a hydroxyl group, a nitro group, a carboxyl group, an alkoxy group, an aryloxy group, a silyloxy group, a heterocyclyloxy group, an acyloxy group, a carbamoyloxy group, an alkoxycarbonyloxy group, an aryloxycarbonyloxy group, an amino group (including an alkylamino group, an arylamino group and a heterocyclylamino group), an ammonio group, an acylamino group, an aminocarbonylamino group, an alkoxycarbonylamino group, an aryloxycarbonylamino group, a sulfamoylamino group, an alkyl- and arylsulfonylamino group, a mercapto group, an alkylthio group, an arylthio group, a heterocyclylthio group, a sulfamoyl group, a sulfo group, an alkyl- and arylsulfinyl group, an alkyl- and arylsulfonyl group, an acyl group, an aryloxycarbonyl group, an alkoxycarbonyl group, a carbamoyl group, an aryl- and heterocyclylazo group, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), a sulfato group (—OS$_3$H), and known other substituents.

More specifically, W represents a halogen atom (such as a fluorine atom, a chlorine atom, a bromine atom or an iodine atom), an alkyl group [which stands for a straight-chain, branched or cyclic, substituted or unsubstituted alkyl group, with examples including an alkyl group (preferably an alkyl group having 1 to 30 carbon atoms, such as methyl, ethyl, n-propyl, isopropyl, t-butyl, n-octyl, eicosyl, 2-chloroethyl, 2-cyanoethyl or 2-ethylhexyl), a cycloalkyl group (preferably a substituted or unsubstituted cycloalkyl group having 3 to 30 carbon atoms, such as cyclohexyl, cyclopentyl or 4-dodecylcyclohexyl), a bicycloalkyl group (preferably a substituted or unsubstituted bicycloalkyl group having 5 to 30 carbon atoms, namely a univalent group formed by removing one hydrogen atom from a bicycloalkane having 5 to 30 carbon atoms, such as bicyclo[1.2.2]heptane-2-yl or bicyclo[2.2.2]octane-3-yl), and an alkyl group having a structure built up of more rings, such as a tricyclo system. As to alkyl moieties in the substituents as mentioned below (e.g., the alkyl moiety in an alkylthio group), it is specified that they not only stand for the alkyl groups falling into the concept mentioned above but also include alkenyl groups and alkynyl groups.], an alkenyl group [which stands for a straight-chain, branched or cyclic, substituted or unsubstituted alkenyl group, with examples including an alkenyl group (preferably a substituted or unsubstituted alkenyl group having 2 to 30 carbon atoms, such as vinyl, allyl, pulenyl, geranyl or oleyl), a cycloalkenyl group (preferably a substituted or unsubstituted cycloalkenyl group having 3 to 30 carbon atoms, namely a univalent group formed by removing one hydrogen atom from a cycloalkene having 3 to 30 carbon atoms, such as 2-cyclopentene-1-yl or 2-cyclohexene-1-yl), and a bicycloalkenyl group (which is a substituted or unsubstituted bicycloalkyl group, preferably a substituted or unsubstituted bicycloalkenyl group having 5 to 30 carbon atoms, namely a univalent group formed by removing one hydrogen atom from a bicycloalkene having one double bond, such as bicyclo[2.2.1]hepto-2-ene-1-yl or bicyclo[2.2.2]octo-2-ene-4-yl)], an alkynyl group (preferably a substituted or unsubstituted alkynyl group having 2 to 30 carbon atoms, such as ethynyl, propargyl or trimethylsilyl-ethynyl), an aryl group (preferably a substituted or unsubstituted aryl group having 6 to 30 carbon atoms, such as phenyl, p-tolyl, naphthyl, m-chlorophenyl or o-hexadecanoylaminophenyl), a heterocyclic (heterocyclic ring) group (which is preferably a univalent group formed by removing one hydrogen atom from a 5- or 6-membered, substituted or unsubstituted, aromatic or non-aromatic heterocyclic compound, far preferably a 5- or 6-membered aromatic heterocyclic group having 3 to 30 carbon atoms, such as 2-furyl, 2-thienyl, 2-pyrimidinyl or 2-benzothiazolyl, or which may be a cationic heterocyclic group such as 1-methyl-2-pyridinio or 1-methyl-2-quinolinio), a cyano group, a hydroxyl group, a nitro group, a carboxyl group, an alkoxy group (preferably a substituted or unsubstituted alkoxy group having 1 to 30 carbon atoms, such as methoxy, ethoxy, isopropoxy, t-butoxy, n-octyloxy or 2-methoxyethoxy), an aryloxy group (preferably a substituted or unsubstituted aryloxy group having 6 to 30 carbon atoms, such as phenoxy, 2-methylphenoxy, 4-t-butylphenoxy, 3-nitrophenoxy or 2-tetradecanoylaminophenoxy), a silyloxy group (preferably a silyloxy group having 3 to 20 carbon atoms, such as trimethylsilyloxy or t-butyldimethylsilyloxy), a heterocyclyloxy group (preferably a substituted or unsubstituted heterocyclyloxy group having 2 to 30 carbon atoms such as 1-phenyltetrazole-5-oxy or 2-tetrahydropyranyloxy), an acyloxy group (preferably a formyloxy group, a substituted or unsubstituted alkylcarbonyloxy group having 2 to 30 carbon atoms or a substituted or unsubstituted aryloxycarbonyloxy group having 6 to 30 carbon atoms, such as formyloxy, acetyloxy, pivaloyloxy, stearoyloxy, benzoyloxy or p-methoxyphenylcarbonyloxy), a carbamoyloxy group (preferably a substituted or unsubstituted carbamoyloxy group having 1 to 30 carbon atoms, such as N,N-dimethylcarbamoyloxy, N,N-diethylcarbamoyloxy, morpholinocarbonyloxy, N,N-di-n-octylaminocarbonyloxy or N-n-octylcarbamoyloxy), an alkoxycarbonyloxy group (preferably a substituted or unsubstituted alkoxycarbonyloxy group having 2 to 30 carbon atoms, such as methoxycarbonyloxy, ethoxycarbonyloxy, t-butoxycarbonyloxy or n-octylcarbonyloxy), an aryloxycarbonyloxy group (preferably a substituted or unsubstituted aryloxycarbonyloxy group having 7 to 30 carbon atoms (preferably a substituted or unsubstituted aryloxycarbonyloxy group having 7 to 30 carbon atoms, such as phenoxycarbonyloxy, p-methoxyphenoxycarbonyloxy or p-n-hexadecyloxyphenoxycarbonyloxy), an amino group (preferably an amino group, a substituted or unsubstituted alkylamino group having 1 to 30 carbon atoms or a substituted or unsubstituted arylamino group having 6 to 30 carbon atoms, such as amino, methylamino, dimethylamino, anilino, N-methyl-anilino or diphenylamino), an ammonio group (preferably an ammonio group or a substituted or unsubstituted alkyl-, aryl- or heterocyclylammonio group having 1 to 30 carbon atoms, such as trimethylammonio, triethylammonio or diphenylmethylammonio), an acylamino group (preferably a formylamino group, a substituted or unsubstituted alkylcarbonylamino group having 1 to 30 carbon atoms or a substituted or unsubstituted arylcarbonylamino group having 6 to 30 carbon atoms, such as formylamino, acetylamino, pivaloylamino, lauroylamino, benzoylamino or 3,4,5-tri-n-octyloxyphenylcarbonylamino), an aminocarbonylamino group (preferably a substituted or unsubstituted aminocarbonylamino group having 1 to 30 carbon atoms, such as carbamoylamino, N,N-dimethylaminocarbonylamino, N,N-diethylaminocarbonylamino or morpholinocarbonylamino), an alkoxycarbonylamino group (preferably a substituted or unsubstituted alkoxycarbonylamino group having 2 to 30 carbon atoms, such as methoxycarbonylamino, ethoxycarbonylamino, t-butoxycarbonylamino, n-octadecyloxycarbonylamino or N-methyl-methoxycarbonylamino), an aryloxycarbonylamino group (preferably a substituted or unsubstituted aryloxycarbonylamino group having 7 to 30 carbon atoms, such as phenoxycarbonylamino, p-chlorophenoxycarbonylamino or m-n-octyloxyphenoxycarbonylamino), a sulfamoylamino group (preferably a substituted or unsubstituted sulfamoylamino group having 0 to 30 carbon atoms, such as sulfamoylamino, N,N-dimethylaminosulfonylamino or N-n-octylaminosulfonylamino), an alkyl- or arylsulfonylamino group (preferably a substituted or unsubstituted alkylsulfonylamino group having 1 to 30 carbon atoms or a substituted or unsubstituted arylsulfonylamino group having 6 to 30 carbon atoms, such as methylsulfonylamino, butylsulfonylamino, phenylsulfonylamino, 2,3,5-trichlorophenylsulfonylamino or p-methylphenylsulfonylamino), a mercapto group, an alkylthio group (preferably a substituted or unsubstituted alkylthio group having 1 to 30 carbon atoms, such as methylthio, ethylthio or n-hexadecylthio), an arylthio group (preferably a substituted or unsubstituted arylthio group having 6 to 30 carbon atoms, such as phenylthio, p-chlorophenylthio or m-methoxyphenylthio), a heterocyclylthio group (preferably a substituted or unsubstituted heterocyclylthio group having 2 to 30 carbon atoms, such as 2-benzothiazolylthio or 1-phenyltetrazole-5-ylthio), a sulfamoyl group (preferably a substituted or unsubstituted sulfamoyl group having 0 to 30 carbon atoms, such as N-ethylsulfamoyl, N-(3-dodecyloxypropyl)sulfamoyl, N,N-dimethylsulfamoyl, N-acetylsulfamoyl, N-benzoylsulfamoyl or N-(N'-phenylcarbamoyl)sulfamoyl), a sulfo group, an alkyl- or arylsulfinyl group (preferably a substituted or unsubstituted alkylsulfinyl group having 1 to 30 carbon atoms or a substituted or unsubstituted arylsulfinyl group 6 to 30 carbon atoms, such as methylsulfinyl, ethylsulfinyl, phenylsulfinyl or p-methylphenylsulfinyl), an alkyl- and arylsulfonyl group (preferably a substituted or unsubstituted alkylsulfonyl group having 1 to 30 carbon atoms or a substituted or unsubstituted arylsulfonyl group having 6 to 30 carbon atoms, such as methylsulfonyl, ethylsulfonyl, phenylsulfonyl or p-methylphenylsulfonyl), an acyl group (preferably a formyl group, a substituted or unsubstituted alkylcarbonyl group having 2 to 30 carbon atoms, a substituted or unsubstituted arylcarbonyl group having 7 to 30 carbon atoms or a substituted or unsubstituted heterocyclylcarbonyl group, having 3 to 30 carbon atoms, the carbonyl group of which is attached to a ring carbon atom, such as acetyl, pivaloyl, 2-chloroacetyl, stearoyl, benzoyl, p-n-octyloxyphenylcarbonyl, 2-pyridylcarbonyl or 2-furylcarbonyl), an aryloxycarbonyl group (preferably a substituted or unsubstituted aryloxycarbonyl group having 7 to 30 carbon atoms, such as phenoxycarbonyl, o-chlorophenoxycarbonyl, m-nitrophenoxycarbonyl or p-t-butylphenoxycarbonyl), an alkoxycarbonyl group (preferably a substituted or unsubstituted alkoxycarbonyl group having 2 to 30 carbon atoms, such as methoxycarbonyl, ethoxycarbonyl, t-butoxycarbonyl or n-octadecyloxycarbonyl), a carbamoyl group (preferably a substituted or unsubstituted carbamoyl group having 1 to 30 carbon atoms, such as carbamoyl, N-methylcarbamoyl, N,N-dimethylcarbamoyl, N,N-di-n-octylcarbamoyl or N-(methylsulfonyl)carbamoyl), an aryl- or heterocyclylazo groups (preferably a substituted or unsubstituted arylazo group having 6 to 30 carbon atoms or a substituted or unsubstituted heterocyclylazo group having 3 to 30 carbon atoms, such as phenylazo, p-chlorophenylazo or 5-ethylthio-1,3,4-thiadiazole-2-ylazo), an imido group (preferably N-succinimido or N-phthalimido), a phosphino group (preferably a substituted or unsubstituted phosphino group having 2 to 30 carbon atoms, such as dimethylphosphino, diphenylphosphino or methylphenoxyphosphino), a phosphinyl group (preferably a substituted or unsubstituted phosphinyl group having 2 to 30 carbon atoms, such as phosphinyl, dioctyloxyphosphinyl or diethoxyphosphinyl), a phosphinyloxy group (preferably a substituted or unsubstituted phosphinyloxy group having 2 to 30 carbon atoms, such as diphenoxyphosphinyloxy or dioctyloxyphosphinyloxy), a phosphinylamino group (preferably a substituted or unsubstituted phosphinylamino group having 2 to 30 carbon atoms, such as dimethoxyphosphinylamino or dimethylaminophosphinylamino), a phospho group, a silyl group (preferably a substituted or unsubstituted silyl group having 3 to 30 carbon atoms, such as trimethylsilyl, t-butylmethylsilyl or phenyldimethylsilyl), a hydrazino group (preferably a substituted or unsubstituted hydrazino group having 0 to 30 carbon atoms, such as trimethylhydrazino), or a ureido group (preferably a substituted or unsubstituted ureido group having 0 to 30 carbon atoms, such as N,N-dimethylureido).

In addition, two Ws can jointly form a ring (more specifically, an aromatic or non-aromatic hydrocarbon or heterocyclic ring, or a polycyclic condensed ring formed by combining such rings together, with examples including a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring and a phenazine ring).

As to the substituents having hydrogen atoms among those which are represented by W, the hydrogen atoms may be removed from them and replaced with any of the groups as recited above. Examples of such substituents include a —CONHSO$_2$— group (a sulfonylcarbamoyl group or a carbonylsulfamoyl group), a —CONHCO— group (a carbonylcarbamoyl group) and a —SO$_2$NHSO$_2$— group (a sulfonylsulfamoyl group), and more specifically, they include an alkylcarbonylaminosulfonyl group (e.g., acetylaminosulfonyl), an arylcarbonylaminosulfonyl group (e.g., benzoylaminosulfonyl), an alkylsulfonylaminocarbonyl group (e.g., methylsulfonylaminocarbonyl) and an arylsulfonylaminocarbonyl group (e.g., p-methylphenylsulfonylaminocarbonyl).

A principal aspect of the invention is a merocyanine dye characterized by its structural formula, namely formula (1). In formula (1), $A_1$ represents a divalent atomic group, n represents an integer of 1 to 3, and $R_{11}$ and $R_{12}$ each represent an alkyl group having 1 to 18 carbon atoms, an aryl group having 6 to 18 carbon atoms or a heterocyclic group having 3 to 18 carbon atoms, and they have the same meanings as $A_1$, n and $R_{11}$ to $R_{18}$ in formula (2) mentioned below, respectively. In addition, preferred examples thereof are also the same as those in formula (2). $A_2$ and $A_3$ each represent an aromatic hydrocarbon ring or a heterocyclic ring having 3 to 18 carbon atoms. The number of carbons in the aromatic hydrocarbon ring is preferably 6 or 10, and the number of carbons in the heterocyclic ring is especially preferably from 3 to 5. The heterocyclic ring is preferably a nitrogen-containing heterocyclic ring. Examples of $A_2$ include a benzene ring, a naphthalene ring, a pyridine ring, a pyrazine ring, a pyrimidine ring, a pyrrole ring, an oxazole ring, a thiazole ring, an imidazole ring, a furan ring and a thiophene ring. The case where both $A_2$ and $A_3$ are benzene rings is especially preferred. In this case, the combination of $A_2$ and $A_3$ forms a naphthalene ring. The aromatic hydrocarbon ring and the heterocyclic ring may have substituents, and examples of these substituents include the groups recited above as examples of W. Substitution of $A_3$ for hydrogen atoms of $A_2$ may be made at any positions as long as they allow the substitution.

It is preferable that the merocyanine dye is represented by formula (2). In formula (2), $A_1$ represents a divalent atomic group (wherein it is the reason for using the term "divalent atomic group" that $A_1$ is required to form a double bond), preferably a divalent group derived from a nitrogen-containing heterocyclic ring, especially a 5- or 6-membered nitrogen-containing heterocyclic ring. Such a heterocyclic ring may be fused with another ring, and the heterocyclic ring and the fused ring may have substituents. The ring fused may be either of aromatic and nonaromatic rings, and it may be either of hydrocarbon and heterocyclic rings. However, the preferred one is an aromatic ring, with examples including aromatic hydrocarbon rings, such as a benzene ring and a naphthalene ring, and aromatic heterocyclic rings, such as a pyrazine ring and a thiophene ring. Examples of substituents those rings may have are the groups recited as W.

More specifically, the nitrogen-containing heterocyclic rings include a thiazoline nucleus, a thiazole nucleus, a benzothiazole nucleus, a naphthothiazole nucleus, an oxazoline nucleus, an oxazole nucleus, a benzoxazole nucleus, a naphthoxazole nucleus, a selenazoline nucleus, a selenazole nucleus, a benzoselenazole nucleus, a naphthoselenazole nucleus, a tellurazoline nucleus, a tellurazole nucleus, a benzotellurazole nucleus, a 3,3-dialkylindolenine nucleus (e.g., 3,3-dimethylindolenine), an imidazoline nucleus, an imidazole nucleus, a benzimidazole nucleus, a pyrroline nucleus, a 2-pyridine nucleus, a 4-pyridine nucleus, a 2-quinoline nucleus, a 4-quinoline nucleus, a 1-isoquinoline nucleus, a 3-isoquinoline nucleus, an imidazo[4,5-b]quinoxazoline nucleus, an oxadiazole nucleus, a thiadiazole nucleus, a pyrazole nucleus, a tetrazole nucleus, and a pyrimidine nucleus, preferably a benzothiazole nucleus, a benzoxazole nucleus, a 3,3-dialkylindolenine nucleus (e.g., 3,3-dimethylindolenine), a benzimidazole nucleus, a 2-pyridine nucleus, a 4-pyridine nucleus, a 2-quinoline nucleus, a 4-quinoline nucleus, a 1-isoquinoline nucleus and a 3-isoquinoline nucleus.

$A_1$ is preferably a benzothiazole nucleus, a benzoxazole nucleus, a 3,3-dialkylindolenine nucleus or a benzimidazole nucleus, far preferably a benzoxazole nucleus, a benzothiazole nucleus or a 3,3-dialkylindolenine nucleus, particularly preferably a benzoxazole nucleus or a benzothiazole nucleus. The substituent W on the nucleus as recited above is preferably a halogen atom, an aryl group, an aromatic heterocyclic group, or a group forming a fused aromatic ring, particularly preferably a 5-membered aromatic heterocyclic group or a group forming a 6-membered fused aromatic ring. The 5-membered aromatic heterocyclic group is preferably a furan ring residue, a thiophene ring residue and a pyrrole ring residue, and the fused aromatic ring is preferably a fused benzene ring or a fused naphthalene ring. Such substituents or fused rings are included in those recited as W. The suitable substitution position is the position 5 of each nucleus.

$R_{11}$ to $R_{18}$ each represent a hydrogen atom or a alkyl group having 1 to 18 carbon atoms, an aryl group having 6 to 18 carbon atoms or a heterocyclic group having 3 to 18 carbon atoms, preferably a hydrogen atom or an alkyl having 1 to 6 carbon atoms, an aryl group having 6 carbon atoms or a heterocyclic group having 3 to 4 carbon atoms, particularly preferably a hydrogen atom. More specifically, the preferred as $R_{11}$ to $R_{18}$ each include a hydrogen atom, a methyl group, an ethyl group, a propyl group, a butyl group, a hexyl group, an octyl group, a decyl group, a dodecyl group, a benzyl group, a phenethyl group, a phenyl group, a tolyl group, a naphthyl group, a pyrrolyl group, a furanyl group, a thiophenyl group, an imidazolyl group, an oxazolyl group and a thiazolyl group, and the far preferred include a hydrogen atom, a methyl group, an ethyl group, a propyl group, a butyl group, a hexyl group, a phenyl group, an imidazolyl group, an oxazole group, and a thiazolyl group. The particularly preferred one among them is a hydrogen atom.

n represents an integer of 1 to 3, preferably 1 or 2, particularly preferably 1.

The compound of formula (2) is preferably a compound of formula (3). $R_{21}$ to $R_{28}$ in formula (3) have the same meanings as $R_{11}$ to $R_{18}$ in formula (2), respectively, and preferred examples thereof are also the same as those in formula (2). $R_{29}$ represents a hydrogen atom or an alkyl group having 1 to 18 carbon atoms, an aryl group having 6 to 18 carbon atoms or a heterocyclic group having 3 to 18 carbon atoms, preferably an alkyl group having 1 to 6 carbon atoms, an aryl group having 6 carbon atoms or a heterocyclic group having 3 to 4 carbon atoms, particularly preferably an alkyl group having 1 to 4 carbon atoms. More specifically, the preferred as $R_{29}$ include a hydrogen atom, a methyl group, an ethyl group, a propyl group, a butyl group, a hexyl group, an octyl group, a decyl group, a dodecyl group, a benzyl group, a phenethyl group, a phenyl group, a tolyl group, a naphthyl group, a pyrrolyl group, a furanyl group, a thiophenyl group, an imidazolyl group, an oxazolyl group and a thiazolyl group, the far preferred include a hydrogen atom, a methyl group, an ethyl group, a propyl group, a butyl group, a hexyl group, a phenyl group, an imidazolyl group, an oxazolyl group and a thiazolyl group, and the particularly preferred include a methyl group, an ethyl group, a propyl group and a butyl group.

The ring structure B in formula (3) is equivalent to a case where $A_1$ in formula (2) is a nitrogen-containing heterocyclic ring residue and has its nitrogen atom at the specified position. Therefore, the heterocyclic ring structures having their individual nitrogen atoms at the position shown in formula (3) among the preferred examples of $A_1$ in formula (2) are preferred examples of the ring structure B.

Suitable examples of the present merocyanine dye are illustrated below.

| Compound Number | D6 | A6 |
|---|---|---|
| Compound 24 | [structure] | [structure] |
| Compound 25 | [structure] | [structure] |
| Compound 26 | [structure] | [structure] |

Since dyes deliver their capabilities through the absorption of light, those having high molar absorption coefficients are generally preferred. High molar absorption coefficients can be achieved by the present merocyanine dyes, and their values achieved are preferably $1.0 \times 10^5$ l/mol/cm or higher, far preferably $1.3 \times 10^5$ l/mol/cm or higher, particularly preferably $1.5 \times 10^5$ l/mol/cm or higher. The molar absorption coefficients adopted in the invention are values measured in the form of a chloroform solution.

The present merocyanine dyes are slightly soluble in general solvents, so they can be used as pigments. In the case of using them as pigments, the dyes can be dispersed with the aid of a solvent and a dispersant. To production of pigments, known methods are applicable.

Examples of a solvent used for the dispersion are given below. They include, e.g., an aqueous solvent (such as water or an aqueous solution of hydrochloric acid or sodium hydroxide), an alcohol solvent, an amide solvent, a ketone solvent, an ether solvent, an aromatic solvent, carbon disulfide, an aliphatic solvent, a nitrile solvent, a sulfoxide solvent, a halogen-containing solvent, an ester solvent, an ionic liquid and a mixture of any two or more of these solvents.

The alcohol solvent is, e.g., methanol, ethanol, isopropyl alcohol, n-propyl alcohol, 1-methoxy-2-propanol or the like. The amide solvent is, e.g., N,N-dimethylformamide, 1-methyl-2-pyrrolidone, 2-pyrrolidinone, 1,3-dimethyl-2-imidazolidinone, ε-caprolactam, formamide, N-methylformamide, acetamide, N-methylacetamide, N,N-dimethylacetamide, N-methylpropanamide, hexamethylphosphoric triamide or the like. The ketone solvent is, e.g., acetone, methyl ethyl ketone, methyl isobutyl ketone, cyclohexanone or the like. The ether solvent is, e.g., dimethyl ether, diethyl ether, tetrahydrofuran or the like. The aromatic solvent is, e.g., benzene, toluene or the like. The aliphatic solvent is, e.g., hexane or the like. The nitrile solvent is, e.g., acetonitrile or the like. The sulfoxide solvent is, e.g., dimethyl sulfoxide, diethyl sulfoxide, hexamethylene sulfoxide, sulfolane or the like. The halogen-containing solvent is, e.g., dichloromethane, trichloroethylene or the like. The ester solvent is, e.g., ethyl acetate, ethyl lactate, 2-(1-methoxy)propyl acetate or the like. The ionic liquid is, e.g., salt of 1-butyl-3-methylimidazolium and $PF_6^-$, or the like.

Examples of a dispersant usable for the dispersion include anionic, cationic, amphoteric, nonionic or pigmentary, low molecular or high molecular dispersants. As to the molecular weight of a high molecular dispersant, there is no particular restriction so long as the dispersant can be homogeneously dissolved in a solvent used together. The molecular weight of a high molecular dispersant used is preferably from 1,000 to 2,000,000, far preferably from 5,000 to 1,000,000, further preferably from 10,000 to 500,000, particularly preferably from 10,000 to 100,000. (In the invention, the term "molecular weight" means "weight-average molecular weight" unless otherwise indicated. A high molecular compound is a polydisperse system, and it is not always uniform in molecular weight or particulate weight. Therefore, the measured value of molecular weight is an average molecular weight obtained by taking an average in some form. Principal among the average values are the following three types. Namely, they are 1) number-average molecular weight Mn, 2) weight-average molecular weight Mw, and 3) Z-average molecular weight Mz, and herein the relation Mn<Mw<Mz holds.)

Examples of a high molecular dispersant which can be used include polyvinyl pyrrolidone, polyvinyl alcohol, polyvinyl methyl ether, polyethylene oxide, polyethylene glycol, polypropylene glycol, polyacrylamide, vinyl alcohol-vinyl acetate copolymer, partially formalated polyvinyl alcohol, partially butyralated polyvinyl alcohol, vinylpyrrolidone-vinyl acetate copolymer, polyethylene oxide/propylene oxide block copolymer, polyacrylic acid salt, polyvinyl sulfate, poly(4-vinylpyridine) salt, polyamide, polyacrylamine salt, fused naphthalenesulfonate, cellulose derivatives and starch derivatives. In addition, naturally-occurring polymers, such as alginate, gelatin, albumin, casein, gum arabic, tragacanth and lignin sulfonate, can also be used. Of these high molecular dispersants, polyvinyl pyrrolidone is preferred over the others. Those high molecular compounds can be used alone or as combinations of two or more thereof. Those dispersants can be used alone or in combination. Of the dispersants used for dispersing pigments, there is a detailed description in "Ganryo Bunsan Anteika to Hyomenshori Gijutsu Hyoka" (which might be literally translated "Stabilization of Pigment Dispersion, and Surface Treatment Technology and Evaluation"), pp. 29-46, Japan Association for International Chemical Information (December, 2001).

Examples of the anionic dispersant (anionic surfactant) include N-acyl-N-alkyltaurine salts, fatty acid salts, alkylsulfuric acid ester salts, alkylbenzenesulfonates, alkylnaphthalenesulfonates, dialkylsulfosuccinates, alkylphosphoric acid ester salts, naphthalenesulfonic acid-formaldehyde condensates, and polyoxyethylene alkylsulfuric acid ester salts. Of these salts, N-acyl-N-alkyltaurine salts are preferred over the others. As the N-acyl-N-alkyltaurine salts, those disclosed in JP-A-3-273067 are suitable. The anionic dispersants recited above can be used alone or as combinations of two or more thereof.

Examples of the cationic dispersant (cationic surfactant) include quaternary ammonium salts, alkoxylated polyamines, aliphatic amine polyglycol ethers, aliphatic amines, diamines and polyamines derived from aliphatic amines and aliphatic alcohols, imidazolines derived from fatty acids, and salts of these cationic substances. These cationic dispersants can be used alone or as combinations of two or more thereof.

The amphoteric dispersant is a dispersant having in its molecule both an anionic moiety the anionic dispersant as recited above has in its molecule and a cationic moiety the cationic dispersant as recited above has in its molecule. Examples of a nonionic dispersant (nonionic surfactant) include polyoxyethylene alkyl ethers, polyoxyethyene alkyl aryl ethers, polyoxyethylene fatty acid esters, sorbitan fatty acid esters, polyoxyethylene sorbitan fatty acid esters, polyoxyethylene alkylamines, and glycerin fatty acid esters. Among them, polyoxyethylene alkyl aryl ethers are preferred over the others. Those nonionic dispersants can be used alone or as combinations of two or more thereof.

When the present merocyanine dyes are used as dyestuffs, it is appropriate that $A_1$ or any of $R_{11}$ to $R_{18}$ in formula (1), or B or any of $R_{21}$ to $R_{29}$ in formula (2) be structured to impart solubility to the dyes. Examples of a substituent having such a function among the substituents represented by W include an alkyl group, an aryl group, a heterocyclic group, an alkoxy group, an aryloxy group and an amino group. Of these groups, an alkyl group and an alkoxy group are preferred over the others.

Embodiment of Photoelectric Conversion Device

A second principal aspect of the invention is a photoelectric conversion device that is equipped with a pair of electrodes and a photoelectric conversion section which is provided between the pair of electrodes and includes a photoelectric conversion layer, and characterized in that an organic dye contained in the photoelectric conversion layer is a merocyanine dye having a fluorescence quantum yield of 10% or higher. Herein, the fluorescence quantum yield is preferably 15% or higher, particularly preferably 20% or higher.

The significance of a fluorescence quantum yield is described below. The present merocyanine dyes are characterized by their high fluorescence quantum yields, and it is thought that this characteristic contributes to high photoelectric conversion efficiency. The mechanism thereof is supposed as follows. An excited state of a dye is returned to its ground state through a non-fluorescence process (a non-radiation deactivation process, an intersystem crossing process, an electron transfer process or so on) and a fluorescence emission deactivation process, and the intensity of fluorescence depends on the velocity ratio between the non-fluorescence process and the fluorescence emission process. The velocity of the fluorescence emission process is controlled by a transition dipole moment, so it depends approximately on a molar absorption coefficient. Therefore, a material having low intensity of fluorescence in spite of its great molar absorption coefficient (such as the comparative material in Example) is short in excited-state life, so it is difficult to utilize the excited state for making photoelectric conversion. On the other hand, the present merocyanine dyes are high in fluorescence quantum yield, so it is rational to think that their excited-state life is long. The excited states of such materials are easy to utilize for making photoelectric conversion, and it is therefore thought that high photoelectric conversion efficiency is achieved.

In Journal of Chemical and Engineering Data, 22 (1977) 379 Table 1, Item X: Merocyanine, merocyanine dyes having fluorescence quantum yields of 10% or lower have been reported.

Figure 1:
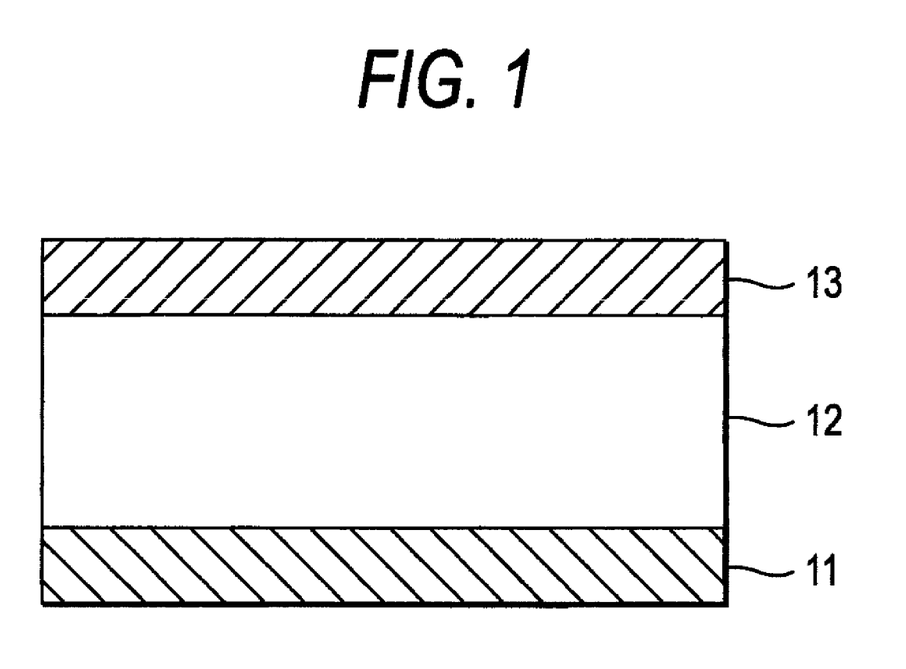
FIG. 1 is a schematic cross-sectional diagram showing a structural outline of a photoelectric conversion device according to an exemplary embodiment of the invention.

FIG. 1 is a schematic cross-sectional diagram showing a general structure of the photoelectric conversion device as an embodiment of the invention.

The photoelectric conversion device shown by FIG. 1 is equipped with at least a lower electrode 11, an upper electrode 13 facing the lower electrode 11 and a photoelectric conversion section 12 provided between the lower electrode 11 and the upper electrode 13.

The upper electrode 13 is a transparent electrode made up of a conductive material transparent to light with wavelengths in the combination of visible and infrared regions (in the region of wavelengths of 400 nm or longer), namely both visible light and infrared light. To the upper electrode 13, a bias voltage is applied via wiring which is not shown in FIG. 1. The polarity setting of this bias voltage is made so that, of charges generated in the photoelectric conversion section 12, electrons can move to the upper electrode 13 and positive holes to the lower electrode 11. Of course, the bias voltage may be set alternatively so that, of charges generated in the photoelectric conversion section 12, positive holes can move to the upper electrode 13 and electrons to the lower electrode 11. Further, it is preferable that the bias voltage is set so that the value obtained by dividing the bias voltage value by the distance between the lower electrode 11 and the upper electrode 13 can fall within the range of $1.0 \times 10^3$ V/cm to $1.0 \times 10^7$ V/cm, preferably the range of $1.0 \times 10^4$ V/cm to $1.0 \times 10^6$ V/cm. By application of such a bias voltage, it becomes feasible to move charges to the upper electrode 13 with efficiency and take out signals responsive to these charges to the outside.

When the device is applied to a solid-state image pickup device of multilayer type, it is preferable to use a transparent electrode as the lower electrode 11 in common with the upper electrode 13 because the lower electrode 11 is required to allow part of incident light to pass downward too. In application to a parallel solid-state image pickup device, it is preferable to use a highly reflective reflecting electrode, such as aluminum film. When electrodes are combined, though they may be turned upside down, the electrode on the light incidence side is required to be transparent. The following descriptions are made in taking the light incidence side as the downside of FIG. 1.

The photoelectric conversion section 12 is a film containing an organic photoelectric conversion material which has its absorption peak in the visible region of the absorption spectrum covering a combination of visible and infrared regions (wavelengths of 400 nm or longer), and generates charges responsive to the light absorbed thereby.

As to such an organic photoelectric conversion material, the merocyanine dyes are used to advantage.

When a photoelectric conversion device including the photoelectric conversion section 12 thus structured is applied to an image pickup device, it is suitable for obtaining information on human luminosity from the photoelectric conversion section 12 that the organic photoelectric conversion material contained in the photoelectric conversion section 12 has its absorption peak within the wavelength region of 400 to 700 nm.

The transmittance and absorbance of the photoelectric conversion section 12 can be adjusted by choosing constituent materials and thicknesses of the upper electrode 13, the lower electrode 11 and the photoelectric conversion section 12 as appropriate.

The term "absorptance and transmittance in the wavelength region of β to β nm" as used in the invention is defined as the values expressed by Y/X×100 wherein X is the integral value in the wavelength region of α to β nm when the absorptance and transmittance are each taken as 100% in the wavelength region of α to β nm and Y is each of the integral values of absorptance and transmittance at each wavelength in the wavelength region of α to β nm.

The optical transparency of the lower electrode 11 greatly affects the absorptance of the upper layer. When the incident light is absorbed and reflected by the lower electrode 11, the absolute quantity of light reaching into the upper layer is reduced, which leads directly to reduction in sensitivity. In order to allow a greater quantity of light to pass through the upper layer and enhance the sensitivity in the photoelectric conversion section 12, the light transmittance of the lower electrode 11 is preferably 90% or higher, far preferably 95% or higher.

As a material for the lower electrode 11 satisfying such a requirement, a transparent conducting oxide (TCO) which is high in both visible light transmittance and infrared light transmittance and low in resistance can be used to advantage. Although thin film of a metal like Au can be used, it causes an extreme increase in resistance when it is tried to attain a transmittance of 90% or higher. Therefore, the use of TCO is preferable. Examples of TCO which can be used to particular advantage include ITO, IZO, AZO, FTO, $SnO_2$, $TiO_2$ and $ZnO_2$.

Although a steep increase in resistance is generally caused when the thickness of conductive material film is reduced to below a certain range, the advisable sheet resistance in the present photoelectric conversion device is preferably from 100 to 10,000Ω/□, so there is a high degree of flexibility in the range of reducible thickness. In addition, the thinner the film thickness of a transparent conductive material, the smaller the quantity of absorbed light. So the light transmittance is generally increased. An increase in the light transmittance is highly favorable because it can increase the quantity of light absorbed in the photoelectric conversion section 12 and can enhance the photoelectric conversion performance. When leak current control, an increase of thin film resistance and an increase of transmittance associated with reduction in film thickness of a transparent conductive material are taken into account, it is advisable that the thickness of transparent conductive material film is preferably from 5 to 100 nm, far preferably from 5 to 20 nm.

When the lower electrode 11 has unevenness at the surface or it has dirt adhering to its surface, formation of the photoelectric conversion section 12 on such a lower electrode 11 by vapor deposition of a low molecular organic photoelectric conversion material tends to produce fine cracks on the uneven portion of the photoelectric conversion section 12 and have portions where the photoelectric conversion section 12 is formed only in reduced thickness. When the upper electrode 13 is further formed on the photoelectric conversion section 12 in such a case, the cracks are covered with a transparent conductive material film, and thereby the upper electrode 13 is partially brought into proximity to the lower electrode 11. Thus, DC short and an increase in leak current tend to occur. As a method for preventing an increase in leak current, it is preferable to form a subbing layer capable of easing the unevenness on the lower electrode 11. The subbing layer can have a great effect when it is formed from a high molecular material, such as polyaniline, polythiophene, polypyrrole, polycarbazole, PTPDES or PTPDEK, by using a spin coating method. When it is intended to form the photoelectric conversion section 12 in vacuo by use of a vapor deposition method in order to avoid contamination with impurities and form uniformly laminated film with more ease, it is preferable that amorphous film is used as the subbing layer.

In the next place, preferred forms of the photoelectric conversion section shown in FIG. 1 are described.

Cases where electrons are captured from the upper electrode 13 are described below. In other cases where positive holes are captured from the upper electrode 13, it is essential only that the film forming sequence be inverted. It is preferable that an electron blocking layer is provided between the photoelectric conversion section 12 and the lower electrode 11. An organic photoelectric conversion material that is a constituent of each of the photoelectric conversion section 12 and the electron blocking layer preferably contains at least either a p-type organic semiconductor or an n-type organic semiconductor.

The organic p-type semiconductors (compounds) are donor organic semiconductors, are mainly represented by those organic compounds which transport holes, and are organic compounds having electron-donating properties. More particularly, when two organic compounds are used in contact with each other, the organic compound showing a smaller ionization potential is referred to as the organic p-type semiconductor. Therefore, any organic compound that has electron-donating properties can be used as the donor organic compound. For example, triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, condensed aromatic hydrocarbon ring compounds (e.g., naphthalene derivatives, anthracene derivatives, phenanthrene derivatives, tethracene derivatives, pyrene derivatives, perylene derivatives, and fluoranthene derivatives), and metal complexes having as a ligand a nitrogen-containing hetero ring compound can be used. Additionally, these are not limitative and, as is described above, an organic compound having a smaller ionization potential than the organic compound used as an n-type (acceptor) compound may be used as the donor organic semiconductor.

The organic n-type semiconductors (compounds) are acceptor organic semiconductors (compounds), are mainly represented by those organic compounds which transport electrons, and are organic compounds having electron-accepting properties. More particularly, when two organic compounds are used in contact with each other, the organic compound showing a larger affinity for electron is referred to as the organic n-type semiconductor. Therefore, any organic compound that has electron-accepting properties can be used as the acceptor organic compound. For example, condensed aromatic hydrocarbon ring compounds (e.g., naphthalene derivatives, anthracene derivatives, phenenthrene derivatives, thetracene derivatives, pyrene derivatives, perylene derivatives, and fluoranthene derivatives), 5- to 7-membered hetero ring compounds containing nitrogen atom, oxygen atom or sulfur atom (e.g., pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrazolidine, pyrrolopyridine, thiadiazolopyridine, dibenzazepine, tribenzazepine, etc.), polyarylene compounds, fluorine compounds, cyclopentadiene compounds, silyl compounds, and metal complexes having as a ligand a nitrogen-containing hetero ring compound are illustrated. Additionally, these are not limitative and, as is described above, an organic compound having a larger affinity for electron than the organic compound used as a donor organic compound may be used as the acceptor organic semiconductor.

Next, the metal complex compounds will be described below. The metal complex compounds are metal complexes which have a ligand containing at least one nitrogen atom, oxygen atom or sulfur atom and coordinating to a metal. The metal ion in the metal complex is not particularly limited, but is preferably beryllium ion, magnesium ion, aluminum ion, gallium ion, zinc ion, indium ion, or tin ion, more preferably beryllium ion, aluminum ion, gallium ion, or zinc ion, still more preferably aluminum ion or zinc ion. As the ligand contained in the above-described metal complex, various publicly known ligands may be cited. For example, there are illustrated those ligands which are described in Photochemistry and Photophysics of Coordination Compounds, published by Springer-Verlag in 1987 and written by H. Yersin; and Yuki Kinzoku Kagaku-Kiso to Oyo published by Shokabo in 1982 and written by Akio Yamamoto.

The ligand is preferably a nitrogen-containing hetero ring ligand (containing preferably from 1 to 30 carbon atoms, more preferably from 2 to 20 carbon atoms, particularly preferably from 3 to 15 carbon atoms and may be a monodentate ligand or a ligand having two or more coordinating sites. The ligand is preferably a bidentate ligand. Examples thereof include a pyridine ligand, a bipyridyl ligand, a quinolinol ligand, a hydroxyphenylazole ligand (e.g., a hydroxyphenylbenzimidazole ligand, a hydroxyphenylbenzoxazole ligand or a hydroxyphenylimidazole ligand)), an alkoxy ligand (containing preferably from 1 to 30 carbon atoms, more preferably from 1 to 20 carbon atoms, particularly preferably from 1 to 10 carbon atoms, and being exemplified by methoxy, ethoxy, butoxy, and 2-ethylhexyloxy), an aryloxy ligand (containing preferably from 6 to 30 carbon atoms, more preferably from 6 to 20 carbon atoms, particularly preferably from 6 to 12 carbon atoms, and being exemplified by phenyloxy, 1-naphthyloxy, 2-nophtyloxy, 2,4,6-trimethylphenyloxy, and 4-biphenyloxy), a heteroaryloxy ligand (containing preferably from 1 to 30 carbon atoms, more preferably from 1 to 20 carbon atoms, particularly preferably from 1 to 12 carbon atoms, and being exemplified by pyridyloxy, pyrazyloxy, pyrimidyloxy, and quinolyloxy), an alkylthio ligand (containing preferably from 1 to 30 carbon atoms, more preferably from 1 to 20 carbon atoms, particularly preferably from 1 to 12 carbon atoms, and being exemplified by methylthio and ethylthio), an arylthio ligand (containing preferably from 6 to 30 carbon atoms, more preferably from 6 to 20 carbon atoms, particularly preferably from 6 to 12 carbon atoms, and being exemplified by phenylthio), a hetero ring-substituted thio ligand (containing preferably from 1 to 30 carbon atoms, more preferably from 1 to 20 carbon atoms, particularly preferably from 1 to 12 carbon atoms, and being exemplified by pyridylthio, 2-benzimidazolylthio, 2-benzoxazolylthio, and 2-benzothiazolylthio), or a siloxy ligand (containing preferably from 1 to 30 carbon atoms, more preferably from 3 to 25 carbon atoms, particularly preferably from 6 to 20 carbon atoms, and being exemplified by a triphenylsiloxy group, a triethoxysiloxy group, and a triisopropylsiloxy group), more preferably a nitrogen-containing hetero ring ligand, an aryloxy ligand, a heteroaryloxy ligand, or a siloxy ligand, sill more preferably a nitrogen-containing hetero ring ligand, an aryloxy ligand, or a siloxy ligand.

The photoelectric conversion section 12 is preferably configured to have a p-type semiconductor layer and an n-type semiconductor layer, wherein at least either of the semiconductors contained is an organic semiconductor, and further have as an interlayer between these semiconductor layers a bulk heterojunction structure layer containing the n-type semiconductor and the p-type semiconductor. In this case, the incorporation of the bulk heterojuction structure into the photoelectric conversion section 12 allows compensation for a disadvantage that the photoelectric conversion section 12 has a short carrier-diffusion length, and enhancement of photoelectric conversion efficiency. Detailed explanations for the bulk heterojunction structure, incidentally, are given in JP-A-2005-303266 (Japanese Patent Application No. 2004-080639).

Alternatively, the photoelectric conversion section 12 can be configured to have two or more tandem structures each of which is a pn junction layer-repeated structure, wherein the pn junction layer is formed of a p-type semiconductor layer and an n-type semiconductor layer. In this case, it is preferable that a thin layer of a conductive material is further inserted between the repeated structures. Any number of pn junction layer-repeated structures (tandem structures) may be included, but enhancement of photoelectric conversion efficiency requires the number of the tandem structures to be preferably from 2 to 50, far preferably from 2 to 30, particularly preferably from 2 to 10. The conductive material is preferably silver or gold, notably silver. The tandem structure, incidentally, is described in detail in JP-A-2005-303266 (Japanese Patent Application No. 2004-079930).

In another preferred case, the photoelectric conversion section 12 has a p-type semiconductor layer and an n-type semiconductor layer (preferably a mixed and dispersed (bulk heterojunction structure) layer), and contains an orientation-controlled organic compound in at least either the p-type semiconductor or the n-type semiconductor, preferably orientation-controlled (controllable) organic compounds in both the p-type semiconductor and the n-type semiconductor. As these organic compounds, compounds having π-conjugated electrons are used to advantage. It is preferable that the orientation of the π-electron plane is not square to a substrate (electrode substrate), but as nearly parallel as possible. The angle which the π-electron plane forms with the substrate is preferably from 0° to 80°, far preferably from 0° to 60°, further preferably from 0° to 40°, preferably from 0° to 20°, particularly preferably from 0° to 10°. And the best angle is 0° (namely parallel to the substrate). Although it is essential only that the layer of an organic compound whose orientation is controlled as specified above be included as at least a part of the whole photoelectric conversion section 12, the proportion of the orientation-controlled part to the whole photoelectric conversion section 12 is preferably 10% or higher, far preferably 30% or higher, further preferably 50% or higher, still further preferably 70% or higher, particularly preferably 90% or higher. And the best proportion is 100%. By controlling the orientation of an organic compound contained in the photoelectric conversion section 12 to the state as specified above, a drawback that the photoelectric conversion section 12 has a short carrier diffusion length is compensated and the photoelectric conversion efficiency is enhanced.

In the case where the orientation of an organic compound is controlled, it is far preferred that a heterojunction plane (e.g., a pn junction plane) is not parallel to the substrate. And it is more advantageous that the orientation of a heterojunction plane is not parallel to the substrate (electrode substrate), but as nearly vertical as possible. The angle which the heterojunction plane forms with the substrate is preferably from 10° to 90°, far preferably from 30° to 90°, further preferably from 50° to 90°, still further preferably from 70° to 90°, particularly preferably from 80° to 90°. And the best angle is 90° (namely vertical to the substrate). It is essential only that the layer of an organic compound whose heterojunction plane is controlled as specified above be included as at least a part of the whole photoelectric conversion section 12. The proportion of the orientation-controlled part to the whole photoelectric conversion section 12 is preferably 10% or higher, far preferably 30% or higher, further preferably 50% or higher, still further preferably 70% or higher, particularly preferably 90% or higher. And the best proportion is 100%. In such cases, the area of the heterojunction plane in the photoelectric conversion section 12 increases, and the quantity of carriers generated at the interface, such as electrons, positive holes or electron-positive hole pairs, increases. Thus, enhancement of photoelectric conversion efficiency becomes possible. In the photoelectric conversion layer where orientations of both the heterojunction plane and the π-electron plane of an organic compound are controlled as mentioned above, the photoelectric conversion efficiency in particular can be enhanced. Detailed explanations for those states are given in JP-A-2006-086493 (Japanese Patent Application No. 2004-079931). As to the thickness of an organic dye layer, the greater the better in point of light absorption. However, when the portion having no contribution to charge separation is considered, the thickness of an organic dye layer is preferably from 30 nm to 300 nm, far preferably from 50 nm to 250 nm, particularly preferably from 80 nm to 200 nm.

When a high molecular compound is used as at least either a p-type semiconductor (compound) or an n-type semiconductor (compound), the film formation thereof is preferably carried out using a wet method which ensures easy film formation. When a dry film-forming method, such as vapor deposition, is used, a high molecular compound is difficult to use because it is in danger of decomposition. Therefore, as a substitute for the high molecular compound, its oligomer is used to advantage. In the case of a low molecular compound, on the other hand, a dry film-forming method, notably a vacuum evaporation method, is preferably employed. The basic parameters of the vacuum evaporation method are the manner in which the compound is heated, as typified by a resistance heating vacuum evaporation method and an electron-beam heating vacuum evaporation method, the shape of an evaporation source—a crucible or a boat, for example, the degree of vacuum, the evaporation temperature, the substrate temperature, the evaporation speed and so on. In order to ensure uniform vapor deposition, it is preferred that the deposition be performed as the substrate is made to spin. As to the degree of vacuum, the higher the better. Specifically, the pressure under which vacuum evaporation is performed is preferably $10^{-4}$ Torr or below, far preferably $10^{-6}$ Torr or below, particularly preferably $10^{-8}$ Torr or below. All steps in a vapor deposition process is preferably carried out in vacuo, and direct contact of the evaporated compound with oxygen and moisture in outside air is basically avoided. The foregoing conditions for the vacuum evaporation are required to be strictly controlled because they affect, e.g., crystallinity, amorphous nature, density and tightness of an organic film formed. PI or PID control of the evaporation speed by use of a film thickness monitor, such as a crystal oscillator or an interferometer, is preferably employed. In the case of simultaneously evaporating two or more kinds of compounds, a vacuum co-evaporation method, a flash evaporation method or the like can be used to advantage.

The electron blocking layer is provided for the purpose of reducing a dark current generated by injection of electrons from the lower electrode 11, and blocks injection of electrons from the lower electrode 11 into the photoelectric conversion section 12. The electron blocking layer can also serve as a subbing layer. In the electron blocking layer, the p-type semiconductor or the hole-transporting organic compound as recited above can also be used.

Materials for the electron blocking layer are equivalent to the p-type semiconductor compounds as recited hereinbefore, and hole transport agents used in organic ELs or the like are preferably applied thereto. The preferred as the compound group of those agents are aromatic amines, notably compounds having triphenylamines as their respective partial structures. Suitable examples of such amines include the compounds and their derivatives as disclosed in Chemical Review, vol. 107, pp. 1233-1271 (2007), ibid., vol. 107, pp. 953-1010 (2007), JP-A-10-59943 and JP-A-2005-243394. More specifically, the compounds having idiomatically used names such as 1-TNATA, 2-TNATA, 4P-TPD, α-NPD, Di-NPD, MeO-TPD, m-MTDATA, Spiro-TAD, Spiro-TTB, TCTA, TPD and AnPC, respectively, and derivatives thereof can be used to advantage.

The lower electrode 11 extracts positive holes from the photoelectric conversion section 12 and collects them, so it is selected with consideration given to adhesiveness to the film adjacent thereto, electron affinity, ionization potential, stability and so on. And the upper electrode 13 extracts electrons from the photoelectric conversion section 12 and discharges them, so it is also selected with consideration given to adhesiveness to the film adjacent thereto, electron affinity, ionization potential, stability and so on.

For the making of electrodes, various methods can be employed according to the materials used. In the case of ITO, for example, film can be formed using an electron beam method, a sputtering method, a resistance heating evaporation method, a chemical reaction method (sol-gel method), a method of coating a dispersion of indium tin oxide, or so on. The ITO film formed can be subjected to UV-ozone treatment, plasma treatment or the like.

Conditions to be met at the time of forming transparent electrode film are mentioned below. The temperature of a silicon substrate during the formation of transparent electrode film is preferably 500° C. or lower, far preferably 300° C. or lower, further preferably 200° C. or lower, still further preferably 150° C. or lower. During the formation of transparent electrode film, a gas may be introduced. The gas introduced basically has no restriction on its kind, and Ar, He, oxygen, nitrogen or so on can be used. In addition, mixtures of those gasses may be used. In a special case where the material used is an oxide, oxygen deficit is often caused, so the use of oxygen is favorable.

The preferred range of surface resistance of a transparent electrode film differs according to whether the transparent electrode film is used as the lower electrode 11 or the upper electrode 13. When the signal readout portion has a CMOS structure, the surface resistance of a transparent conductive film is preferably 10,000Ω/□ or lower, far preferably 1,000Ω/□ or lower. Suppose that the signal readout portion has a CCD structure, on the other hand, the surface resistance is preferably 1,000Ω/□ or lower, far preferably 100Ω/□ or lower. When the transparent electrode film is used as the upper electrode 13, the surface resistance is preferably 1,000, 000Ω/□ or lower, far preferably 100,000Ω/□ or lower.

The upper electrode 13 is preferably made plasma-free. By the plasma-free making of the upper electrode 13, the impact of plasma upon the substrate can be lessened and photoelectric conversion characteristics can be improved. The term "plasma-free" used herein means a state of generating no plasma during the film formation for the upper electrode 13 or a state in which the plasma reaching the substrate is reduced by putting a distance of at least 2 cm, preferably at least 10 cm, far preferably at least 20 cm, between the plasma generation source and the substrate.

The apparatus of the type which generates no plasma during the film formation for the upper electrode 13 is, e.g., electron-beam evaporation apparatus (EB evaporation apparatus) or pulse-laser evaporation apparatus. Examples of EB evaporation apparatus and pulse-laser evaporation apparatus usable as the apparatus of such a type include those described in Yutaka Sawada (editor), Tomei Dodenmaku no Shintenkai (which might be literally translated "New Evolution of Transparent Conductive Film"), CMC Publishing Co., Ltd. (1999); Yutaka Sawada (editor), Tomei Dodenmaku no Shintenkai II, CMC Publishing Co., Ltd. (2002); JSPS (Japan Society for the Promotion of Science), Tomei Dodenmaku no Gijutu (which might be literally translated "Technology of Transparent Conductive Film"), Ohmsha, Ltd. (1999); and references appended to these books. Hereafter, the method of forming transparent electrode film by use of EB evaporation apparatus is referred to as "an EB evaporation method", and the method of forming transparent electrode film by use of pulse-laser evaporation apparatus is referred to as "a pulse-laser evaporation method". To be more specific, it is preferred that aluminum film be formed by a vacuum heating evaporation method.

As to the apparatus capable of ensuring such a state that the distance from a plasma generation source to the substrate is 2 cm or greater and arrival of plasma at the substrate is reduced (which is referred to as "plasma-free film formation apparatus"), opposed target sputtering apparatus, an arc plasma evaporation apparatus or the like can be considered, and those usable as such apparatus include the variety of apparatus described in Yutaka Sawada (editor), Tomei Dodenmaku no Shintenkai, CMC Publishing Co., Ltd. (1999); Yutaka Sawada (editor), Tomei Dodenmaku no Shintenkai II, CMC Publishing Co., Ltd. (2002); JSPS, Tomei Dodenmaku no Gijutu, Ohmsha, Ltd. (1999); and references appended to these books.

The materials suitable for transparent electrode film are those which can be formed into film by use of plasma-free film formation apparatus, EB evaporation apparatus or pulse-laser evaporation apparatus. Examples of such materials include metals, alloys, metal oxides, metal nitrides, metal borides, organic conductive compounds, and mixtures of two or more of the materials recited above. More specifically, conductive metal oxides including tin oxide, zinc oxide, indium oxide, indium zinc oxide (IZO), indium tin oxide (ITO), indium wolfram oxide (IWO) and like, metal nitrides including titanium nitride and the like, metals including gold, platinum, silver, chromium, nickel, aluminum and the like, mixtures or laminates of those metals and conductive metal oxides, inorganic conductive substances including copper iodide, copper sulfide and the like, organic conductive materials including polyaniline, polythiophene, polypyrrole and the like, and laminates of those organic conductive materials and ITO are given as the examples. In addition, it is also advisable to use the materials described in detail, e.g., in Yutaka Sawada (editor), Tomei Dodenmaku no Shintenkai, CMC Publishing Co., Ltd. (1999); Yutaka Sawada (editor), Tomei Dodenmaku no Shintenkai II, CMC Publishing Co., Ltd. (2002); and JSPS, Tomei Dodenmaku no Gijutu, Ohmsha, Ltd. (1999).

EXAMPLES

The invention is illustrated below in detail by reference to the following examples. As a matter of course, the invention should not be construed as being limited to these examples.

Example 1

To 3.2 g of 50% NaH, a mixed solution of 10 g of naphthalene-2,3-dicarboxylic acid dimethyl ester and 15 ml of ethyl acetate was added dropwise, and heated under reflux for 4 hours. After cooling to room temperature, the resulting reaction solution was passed through a filter, and the filtrate was added to a solution prepared by mixing 20 ml of hydrochloric acid and 200 ml of water and warming them to 80° C., and then stirred for 10 minutes. After cooling to room temperature, the filtration and subsequent drying were carried out. Thus, 4.1 g of Intermediate 1 was obtained.

Acetonitrile in an amount of 40 ml was added to a 2.0 g portion of Intermediate 1 and 2.2 g of N,N'-diphenylformamidine, and heated under reflux for 5 hours. After cooling to room temperature, the resulting reaction solution was filtered to give 2.4 g of Intermediate 2.

Intermediate 1

Intermediate 2

A 0.6 g portion of Intermediate 2, 0.8 g of 1,2,3,3-tetramethylindolium iodide, 0.4 ml of piperidine and 20 ml of acetonitrile were heated under reflux for 16 hours, then cooled to room temperature, filtered off, washed successively with acetonitrile, water, isopropanol and hexane in the order mentioned, and further dried. Thus, 0.4 g of Compound 1 according to the invention was obtained. In each of methanol, ethanol, isopropanol, acetonitrile and water, Compound 1 dissolved slightly in a concentration of 1 wt % or lower. Because Compound 1 dissolved in chloroform, physical data concerning the solution system thereof was collected using its chloroform solution. NMR (CDCl$_3$): 1.78 (s, 6H), 3.56 (s, 3H), 7.03 (d, 1H), 7.20 (t, 1H), 7.34-7.4 (m, 2H), 7.55-7.65 (m, 3H), 7.96-8.06 (m, 2H), 8.23 (d, 1H), 8.24 (s, 1H), 8.28 (s, 1H). MS (MALD1, M/z): 380 (MH+). Absorption Characteristic (chloroform): λmax 518 nm, molar absorption coefficient 142,000 l/mol/cm). Melting point: 291° C.

A 0.6 g portion of Intermediate 2, 0.6 g of 1-ethyl-2-methylbenzoxazolium iodide, 0.2 ml of piperidine, 20 ml of acetonitrile and 5 ml of N,N-dimethylacetamide were heated under reflux for 11 hours, then cooled to room temperature, filtered off, washed successively with acetonitrile, water, isopropanol and hexane in the order mentioned, and further dried. Thus, 0.4 g of Compound 2 according to the invention was obtained. In each of methanol, ethanol, isopropanol, acetonitrile and water, Compound 2 dissolved slightly in a concentration of 1 wt % or lower. Because Compound 2 dissolved in chloroform, physical data concerning the solution system thereof was collected using its chloroform solution. NMR (CDCl$_3$): 1.53 (t, 3H), 4.18 (q, 2H), 7.16-7.40 (m, 4H), 7.50 (d, 1H), 7.53-7.60 (m, 2H), 7.95-8.06 (m, 2H), 8.17 (s, 1H), 8.24 (s, 1H), 8.35 (d, 1H). MS (MALD1, M/z): 368

(MH+) Absorption Characteristic (chloroform): λmax 496 nm, molar absorption coefficient 158,000 l/mol/cm). Melting point: 294° C.

A 0.6 g portion of Intermediate 2, 0.7 g of 1-ethyl-2-methylbenzothiazolium iodide, 0.2 ml of piperidine and 5 ml of N,N-dimethylacetamide were heated at 100° C. for 7 hours with stirring, then cooled to room temperature, filtered off, washed successively with acetonitrile, water, isopropanol and hexane in the order mentioned, and further dried. Thus, 0.7 g of Compound 3 according to the invention was obtained. In each of methanol, ethanol, isopropanol, acetonitrile and water, Compound 3 dissolved slightly in a concentration of 1 wt % or lower. Because Compound 3 dissolved in chloroform, physical data concerning the solution system thereof was collected using its chloroform solution. NMR (CDCl$_3$): 1.53 (t, 3H), 4.32 (q, 2H), 7.25-7.35 (m, 2H), 7.42 (t, 1H), 7.53-7.60 (m, 2H), 7.64 (d, 1H), 7.76 (d, 1H), 7.93 (d, 1H), 7.95-8.04 (m, 2H), 8.15 (s, 1H), 8.22 (s, 1H). MS (MALD1, M/z): 384 (MH+). Absorption Characteristic (chloroform): λmax 533 nm, molar absorption coefficient 184,000 l/mol/cm). Melting point: 314° C.

A 0.5 g portion of Intermediate 2, 0.7 g of 1-ethyl-2-methylnaphthothiazolium tosylate, 0.2 ml of piperidine and 5 ml of N,N-dimethylacetamide were heated at 100° C. for 8 hours with stirring, then cooled to room temperature, filtered off, washed successively with acetonitrile, water, isopropanol and hexane in the order mentioned, and further dried. Thus, 0.4 g of Compound 8 according to the invention was obtained. In each of methanol, ethanol, isopropanol, acetonitrile and water, Compound 8 dissolved slightly in a concentration of 1 wt % or lower. Because Compound 8 dissolved in chloroform, physical data concerning the solution system thereof was collected using its chloroform solution. NMR (CDCl$_3$): 1.58 (t, 3H), 4.24 (q, 2H), 7.23 (d, 1H), 7.48 (s, 1H), 7.50-7.55 (m, 2H), 7.56-7.65 (m, 2H), 7.80 (s, 1H), 7.83-7.94 (m, 2H), 7.96-8.03 (m, 2H), 8.18 (s, 1H), 8.26 (s, 2H), 8.40 (d, 2H). MS (MALD1, M/z): 418 (MH+). Absorption Characteristic (chloroform): λmax 503 nm, molar absorption coefficient 199,000 l/mol/cm). Melting point: 314° C.

The merocyanine dyes of the invention have molar absorption coefficient values of $1.4 \times 10^5$ or greater, which are greater than the values of $0.5 \times 10^5$ to $1.0 \times 10^5$ that general merocyanine dyes have, and so can absorb light with efficiency. Accordingly, the present merocyanine dyes are useful as dyes and colorants. In addition, the present merocyanine dyes are slightly soluble in solvents, such as methanol, ethanol, isopropanol, acetonitrile and water, so useful as pigments. Further, they are soluble in chloroform and the like, so useful as dyestuffs too though there are restrictions on usable solvent or solubilization is required.

Figure 2:
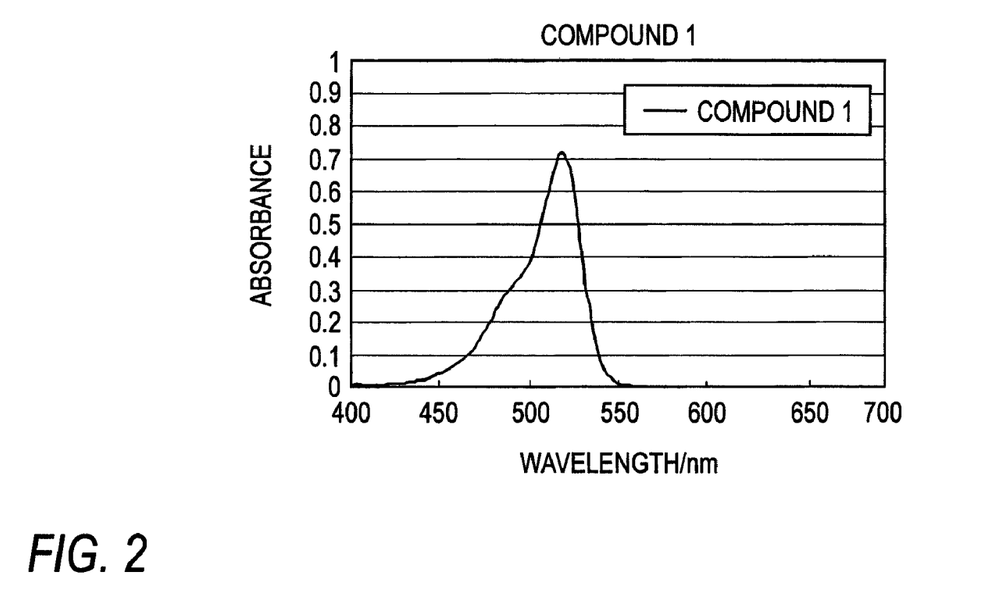
FIG. 2 shows solution absorption spectra of the present Compounds 1 and 2.
Figure 3:
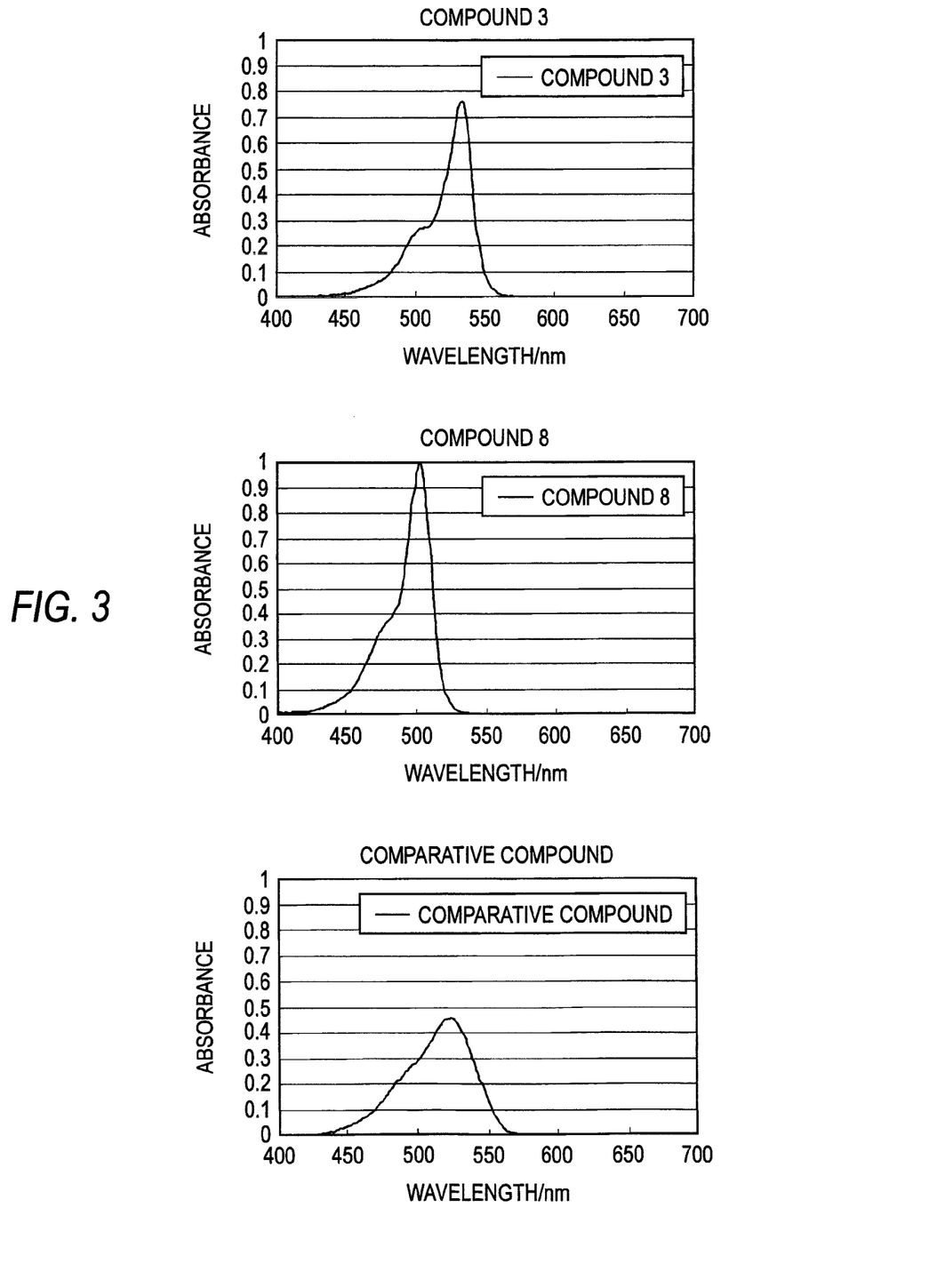
FIG. 3 shows solution absorption spectra of the present Compounds 3 and 8 and Comparative Compound 1.

Solution absorption spectra of Compound 1 and Compound 2 according to the invention are shown in FIG. 2, and those of Compound 3 and Compound 8 according to the invention and Comparative Compound are shown in FIG. 3.

Example 2

On a silicon substrate, 30 nm-thick amorphous ITO film was formed by a sputtering method to make a lower electrode. On the lower electrode thus made, a photoelectric conversion layer was formed by evaporating 100 nm-thick film of Compound A represented by the following chemical formula onto the lower electrode by vacuum heating and then evaporating Compound 1 film having a thickness of about 100 nm onto the Compound A film by vacuum heating. On the photoelectric conversion layer thus formed, aluminum was formed into film by a vacuum heating evaporation method to make an upper electrode. Thus, a photoelectric conversion device 1 was prepared. By replacing Compound 1 with Compound 2, Compound 3, Compound 8 and Comparative Compound 1 (produced by HAYASHIBARA BIOCHEMICAL LABS., INC.: λmax 520 nm, molar absorption coefficient 91,100 l/mol/cm), respectively, photoelectric conversion devices 2, 3 and 4 and a photoelectric conversion device for comparison were prepared.

Compound A

Comparative Compound 1

<Evaluation of Fluorescence Quantum Yield>

A chloroform solution of each merocyanine sample was prepared, and diluted so that its absorbance at the absorption maximum wavelength reached 0.15. The emission spectrum of this solution on the longer wavelength side of the absorption maximum wavelength was measured with fluorescence spectrum measuring apparatus, wherein the absorption maximum wavelength was used as excitation wavelength, and the area of its emission band was determined as a relative value with reference to the emission intensity of Comparative Compound 1. According to Journal of Chemical and Engineering Data, vol. 22, p. 379 (1977), the fluorescence quantum yield of Comparative Compound 1 is 0.006, and on the basis of this finding the fluorescence quantum yield of each merocyanine dye was determined.

<Performance Test>

Each of the devices obtained were examined for current characteristics in the dark and under irradiation with visible light, respectively, by means of apparatus for photoelectric conversion efficiency (IPCE) measurement while applying thereto an electric field of $4.5 \times 10^5$ V/cm. By shifting the wavelength of irradiation light under the bright condition, a photoelectric conversion spectrum was obtained. In addition, a voltage of 5V was applied to each device, instantaneous light irradiation was caused to start by use of a light-emitting diode, and signals generated by the device were observed with an oscilloscope. The current from 100 ms onward was regarded as steady-state current, and the time required to reach 99% of the steady-state current was determined. The result obtained was referred to as a response time.

The results of photoelectric conversion efficiency measurements made on the photoelectric conversion device 1, the photoelectric conversion device 2, the photoelectric conversion device 3, the photoelectric conversion device 4 and the photoelectric conversion device for comparison, and the results of dark current and response time measurements made on those devices are shown in Table 1.

TABLE 1

| Photoelectric conversion device | Compound | Fluorescence quantum yield (%) | Photoelectric conversion efficiency (relative value) | Dark current (nA) | Response time (relative value) |
| --- | --- | --- | --- | --- | --- |
| 1 | Compound 1 | 23 | 2.6 | 0.1 | 0.38 |
| 2 | Compound 2 | 37 | 1.9 | 0.15 | 0.50 |
| 3 | Compound 3 | 26 | 3.4 | 0.2 | 0.30 |
| 4 | Compound 8 | 79 | 3.1 | 0.2 | 0.35 |
| For comparison | Comparative Compound 1 | 0.6 | 1.0 | 0.15 | 1.00 |

As can be seen from Table 1, the devices using the compounds of the invention achieved photoelectric conversion efficiency approximately several times higher than that of the device for comparison while generating dark current at more of the same level as the device for comparison did, and further the present devices were superior in response time.

What is claimed is:

1. A merocyanine dye represented by formula (1):

wherein $A_1$ represents a divalent nitrogen-containing heterocyclic ring, n represents an integer of 1 to 3, $A_2$ and $A_3$ each independently represents an aromatic hydrocarbon ring or a heterocyclic ring having 3 to 18 carbon atoms, and $R_{11}$ and $R_{12}$ each independently represents a hydrogen atom, an alkyl group having 1 to 18 carbon atoms, an aryl group having 6 to 18 carbon atoms, or a heterocyclic group having 3 to 18 carbon atoms.

2. The merocyanine dye according to claim 1, which is represented by formula (2):

wherein $A_1$ has the same meaning as $A_1$ in formula (1), n represents an integer of 1 to 3, and $R_{11}$ to $R_{18}$ each independently represents a hydrogen atom, an alkyl group having 1 to 18 carbon atoms, an aryl group having 6 to 18 carbon atoms, or a heterocyclic group having 3 to 18 carbon atoms.

3. The merocyanine dye according to claim 2, which is represented by formula (3):

wherein B represents a ring structure, $R_{21}$ to $R_{29}$ each independently represents a hydrogen atom, an alkyl group having 1 to 18 carbon atoms, an aryl group having 6 to 18 carbon atoms, or a heterocyclic group having 3 to 18 carbon atoms, and n represents an integer of 1 to 3.

4. The merocyanine dye according to claim 1, which is a dyestuff or pigment.

5. A thin dye film comprising a merocyanine dye according to claim 1.

6. A photoelectric conversion device comprising:
a pair of electrodes; and
a photoelectric conversion section which is provided between the pair of electrodes and includes a photoelectric conversion layer containing an organic dye, wherein the organic dye is a merocyanine dye of claim 1.

7. The photoelectric conversion device according to claim 6, further comprising a charge transporting layer.

8. The photoelectric conversion device according to claim 6, further comprising an electron blocking layer between the pair of electrodes.

9. The photoelectric conversion device according to claim 6, wherein the pair of electrodes contains a transparent conducting oxide.

10. The photoelectric conversion device according to claim 9, wherein the transparent conducting oxide is iridium tin oxide.

* * * * *